United States Patent [19]
Kuo

[11] Patent Number: 5,844,269
[45] Date of Patent: *Dec. 1, 1998

[54] EEPROM CELL HAVING REDUCED CAPACITANCE ACROSS THE LAYER OF TUNNEL OXIDE

[75] Inventor: Max C. Kuo, San Leandro, Calif.

[73] Assignee: National Semiconductor Corporation, Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 674,400

[22] Filed: Jul. 2, 1996

[51] Int. Cl.$^6$ .................................................. H01L 29/788
[52] U.S. Cl. ........................................... 257/315; 438/264
[58] Field of Search ............................. 257/30, 315, 321, 257/333, 336; 438/263, 264

[56] References Cited

U.S. PATENT DOCUMENTS 4,823,175  4/1989  Fontana .................................. 257/321
5,585,656  12/1996  Hsue et al. ............................. 257/321

OTHER PUBLICATIONS

Kolodny, A. et al., "*Analysis and Modeling of Floating–Gate EEPROM Cells,*" pp. 128–129 [Reprinted from IEEE Trans. Electron Devices, vol. ED–33, No. 6, pp. 835–844, Jun. 1986].

*Primary Examiner*—Olik Chaudhuri
*Assistant Examiner*—Howard Weiss
*Attorney, Agent, or Firm*—Limbach & Limbach L.L.P.

[57] ABSTRACT

The capacitance across the layer of tunnel oxide in an electrically-erasable programmable read-only-memory (EEPROM) cell is reduced by forming the layer of tunnel oxide to have a first region which is substantially thicker than a second region. The thicker region of tunnel oxide results from doping the buried region exposed by the tunnel window so that the buried region has different levels of dopant concentration. When the tunnel oxide is then grown over the buried region, the oxide formed over the more heavily doped portion grows at a faster rate than does the portion with the lower dopant concentration.

19 Claims, 4 Drawing Sheets

EEPROM CELL HAVING REDUCED CAPACITANCE ACROSS THE LAYER OF TUNNEL OXIDE

BACKGROUND OF THE INVENTION

1. Field of the Invention

The present invention relates to a method for forming an electrically-erasable programmable read-only-memory (EEPROM) cell and, more particularly, to a method for reducing the capacitance across the layer of tunnel oxide of the cell.

2. Description of the Related Art

An electrically-erasable programmable read-only-memory (EEPROM) cell is an information storage device that utilizes the non-volatile storage of an electric charge as the information storage mechanism. EEPROM cells differ from other non-volatile memory cells in that EEPROM cells are both programmed and erased by means of Fowler-Nordheim tunneling.

FIG. 1 shows a cross-sectional diagram that illustrates a portion of a conventional EEPROM cell 10. As shown in FIG. 1, EEPROM cell 10 includes buried N+ (BN+) source and drain regions 14 and 16, respectively, which are formed in a lightly-doped p-type substrate 12, and BN+ oxide regions 18 and 20 which are grown over BN+ source and drain regions 14 and 16, respectively. BN+ oxide region 20, in turn, includes a tunnel window 22 that exposes a portion of drain region 16.

As further shown in FIG. 1, EEPROM cell 10 also includes a thin layer of tunnel oxide 24 that is formed over drain region 16 in tunnel window 22, and a thicker layer of gate oxide 26 that is formed over substrate 12 between BN+ source and drain regions 14 and 16. In addition, EEPROM cell 10 further includes a floating gate 30 which is formed over BN+ oxide regions 18 and 20, tunnel oxide layer 24, and gate oxide layer 26, and a control gate 34 which is formed over floating gate 30 and isolated therefrom by a layer of interpoly dielectric 32.

In operation, cell 10 is programmed by applying a program voltage to control gate 34, grounding BN+ drain region 16, and floating BN+ source region 14. Under these bias conditions, electrons from drain region 16 tunnel through tunnel oxide layer 24 by way of the well-known Fowler-Nordheim tunneling mechanism, and begin accumulating on floating gate 30 where the increased negative charge raises the threshold voltage of the cell.

Similarly, cell 10 is erased by grounding control gate 34, applying an erase voltage to BN+ drain region 16, and floating BN+ source region 14. Under these bias conditions, electrons from floating gate 30 tunnel back through tunnel oxide layer 24 to drain region 16 where the reduced negative charge on floating gate 30 lowers the threshold voltage of the cell. (The thickness of gate oxide layer 26 and the magnitudes of the program and erase voltages are selected so that Fowler-Nordheim tunneling does not occur through gate oxide layer 26).

Once programmed or erased, cell 10 is read by applying a first read voltage to control gate 34, grounding source region 14, and applying a second read voltage to drain region 16. When cell 10 is erased, a large current will flow from drain region 16 to source region 14 due to the lower threshold voltage of an erased cell, while a much smaller current or no current at all will flow from drain region 16 to source region 14 when cell 10 is programmed due to the higher threshold voltage of a programmed cell.

One of the limitations of EEPROM cell 10 is that, during the fabrication of cell 10, a wet etch process is conventionally used to form tunnel window 22 in BN+ oxide region 20 due to the need to preserve the integrity of the silicon at the surface of drain region 16. By preserving the integrity of the silicon, a higher quality layer of tunnel oxide can be grown over the surface of drain region 16 than can be grown following the use of a standard dry etch process.

The drawback of using a conventional wet etch process, however, is that the process is isotropic. As a result, the size of the tunnel window produced by a conventional wet etch process is significantly larger than the size of the tunnel window produced by a standard dry etch process.

The drawback of a large tunnel window is that as the size of the tunnel window increases, the capacitance across the layer of tunnel oxide increases which, in turn, decreases the threshold voltage range of the cell. A decreased threshold voltage range, in turn, produces a number of undesirable results that include a reduced manufacturing yield, an increased time to read the cell, and a shortened endurance life of the cell.

FIG. 2 shows a graphical diagram that illustrates these undesirable results by comparing the programming window of a cell with a large tunnel window to the programming window of a cell with a small tunnel window. As shown in FIG. 2, when a cell is programmed with a predetermined program voltage for a predetermined period of time, the cell having a small tunnel window is programmed to a threshold voltage $V_{PS}$ while the cell having a large tunnel window is programmed to a threshold voltage $V_{PL}$.

The difference in the programmed threshold voltages $V_P$ is caused by the increased capacitance across the layer of tunnel oxide that is associated with a larger tunnel window. The increased capacitance reduces the program/erase voltage across the layer of tunnel oxide which, in turn, reduces the number of electrons that can tunnel through the layer of tunnel oxide for a specified program/erase time (typically 5–10 mS). By reducing the number of tunneling electrons, the programmed threshold voltage of the cell is also reduced.

Similarly, when the cell is erased with a predetermined erase voltage for a predetermined period of time, the cell having a small tunnel window is erased to a threshold voltage $V_{ES}$ while the cell having a large tunnel window is erased to a threshold voltage $V_{EL}$. The difference between the programmed and erased threshold voltages $V_P$ and $V_E$, in turn, defines the programming window of the cell. Thus, as shown in FIG. 2, the threshold voltage range, or the programming window, of a cell with a large tunnel window is less than the threshold voltage range of a cell with a smaller tunnel window.

Although FIG. 2 shows both of the programming windows with fixed threshold voltages $V_{PS}/V_{PL}$ and $V_{ES}/V_{EL}$, the actual threshold voltages of a given sample of EEPROM cells are distributed around the programmed and erased threshold voltages $V_{PS}/V_{PL}$ and $V_{ES}/V_{EL}$.

As a result, some number of EEPROM cells from a given sample will have a programmed threshold voltage $V_P$ that is so low that the cell is read as erased when the cell is actually programmed, while some number of EEPROM cells will have an erased threshold voltage $V_E$ that is so high that the cell is read as programmed when the cell is actually erased.

Thus, since cells with a large tunnel window and, therefore, a large capacitance across the layer of tunnel oxide, have an overall distribution of programmed and erased threshold voltages that are lower and higher, respectively, than the overall distribution of cells with a smaller tunnel window and a smaller capacitance, there will be more large tunnel window cells that produce an erroneous reading than small tunnel window cells, thereby reducing the manufacturing yield.

In addition, conventional EEPROM cells are read by comparing the current that flows through a cell with a reference current. The time required to make the comparison is a function of the difference in the magnitudes of the two currents, with a large difference in magnitude between the cell current and the reference current requiring less time than a small difference in magnitude.

Thus, for example, when an erased cell is read, the cell current should be much greater than the reference current to read the cell in the shortest amount of time. However, since cells with a large tunnel window and, therefore, a large capacitance, have an overall distribution of erased threshold voltages $V_E$ that is higher than the overall distribution of cells with a smaller tunnel window and a smaller capacitance, cells with a large tunnel window will output less current when read than cells with a smaller tunnel window. The reduced current flow reduces the difference in magnitude between the cell current and the reference current which, in turn, increases the time required to read the cell.

Further, repeated programming and erasing over the lifetime of a cell cause traps to be formed in the tunnel oxide which, in turn, gradually reduce the programmed threshold voltages $V_P$ of the cells, and gradually increase the erased threshold voltages $V_E$. As a result, this process, known as window narrowing, continually reduces the programming window of the cells and eventually causes the cells to fail.

Thus, since cells with a large tunnel window and capacitance have an overall distribution of programmed threshold voltages that is lower than the overall distribution of cells with a smaller tunnel window and capacitance, cells with a large tunnel area will suffer from reduced program/erase margins and fail sooner than cells with a smaller tunnel window.

Therefore, in view of the above, there is a need for a method for reducing the capacitance across the layer of tunnel oxide in an EEPROM cell.

SUMMARY OF THE INVENTION

The present invention reduces the capacitance across the layer of tunnel oxide in an electrically-erasable programmable read-only-memory (EEPROM) cell by utilizing a layer of tunnel oxide that has a first region which is substantially thicker than a second region.

In accordance with the present invention, a memory cell, which is formed in a substrate of a first conductivity type, includes first and second regions of a second conductivity type which are formed in the substrate. The second region is spaced apart from the first region, and has first, second, and third surface regions.

In addition, the memory cell of the present invention also includes first, second, and third dielectrics which contact the first, second, and third surface regions, respectively, and have first, second, and third thicknesses, respectively.

In the present invention, the second thickness is greater than the first thickness, and the third thickness is greater than the second thickness. In addition, the second dielectric contacts the first dielectric, and the third dielectric contacts the first and second dielectrics.

A better understanding of the features and advantages of the present invention will be obtained by reference to the following detailed description and accompanying drawings which set forth an illustrative embodiment in which the principals of the invention are utilized.

DETAILED DESCRIPTION

Figure 1:
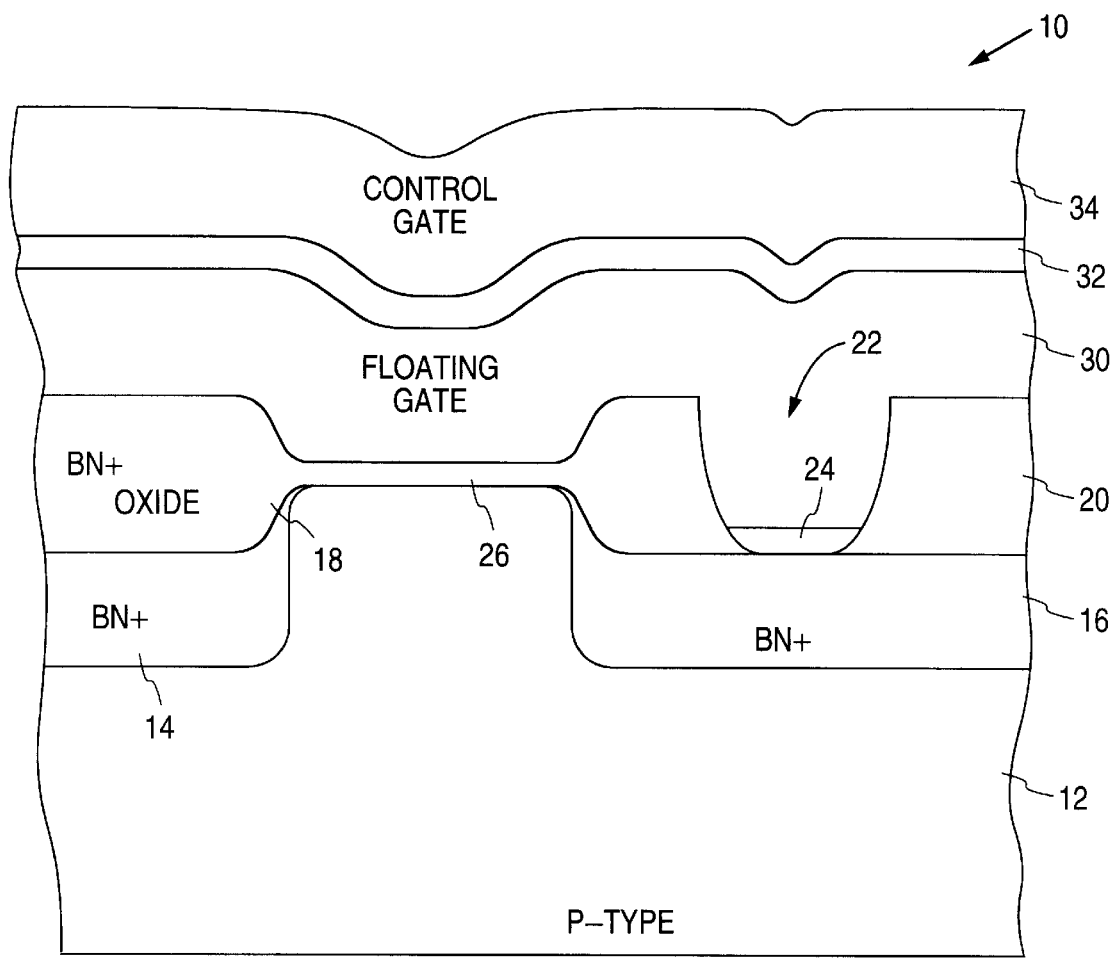
FIG. 1 is a cross-sectional diagram illustrating a portion of a conventional EEPROM cell 10.
Figure 2:
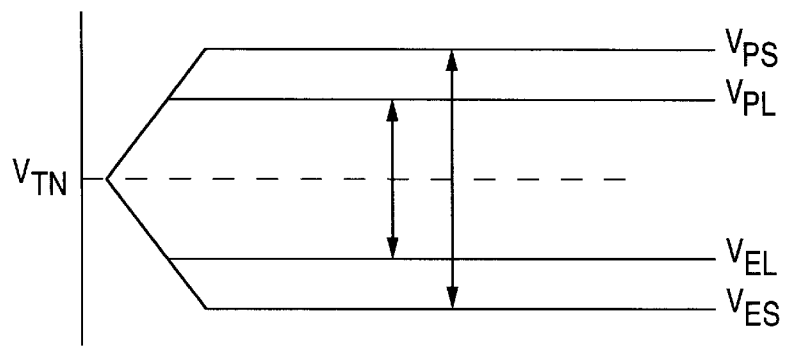
FIG. 2 is a graphical diagram illustrating the programming windows of cells with a large and small tunnel window.
Figure 3A:
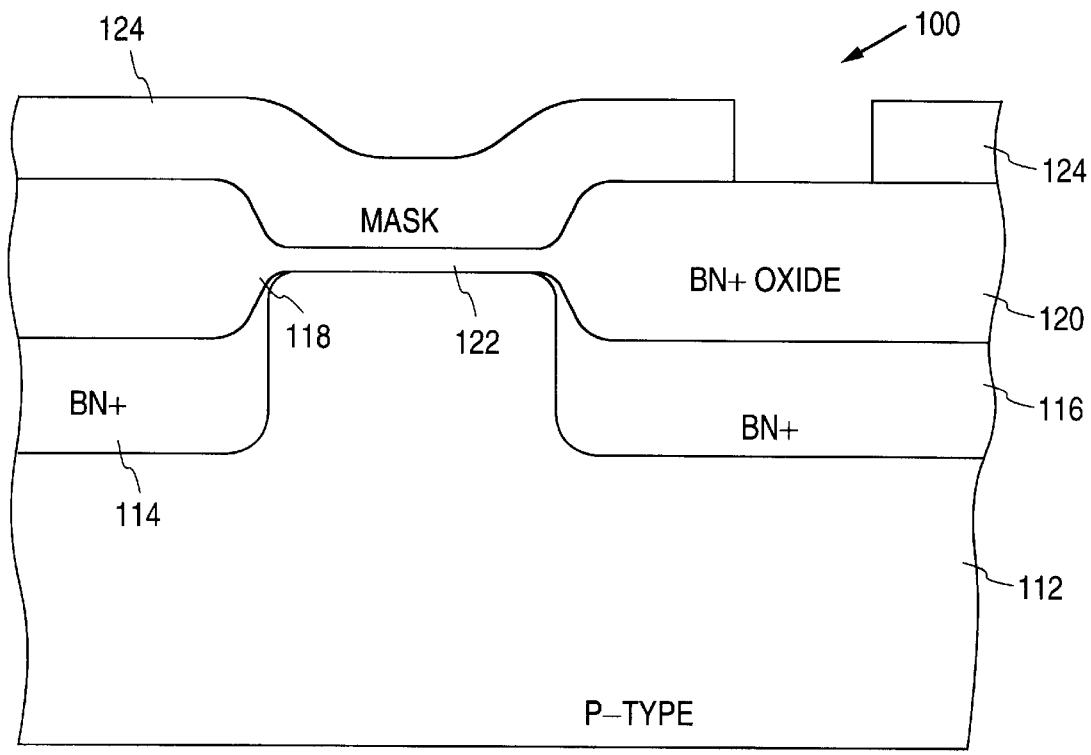
FIGS. 3A–3D are cross-sectional diagrams illustrating a method for reducing the capacitance across the layer of tunnel oxide of an EEPROM cell in accordance with the present invention.

FIGS. 3A–3D show cross-sectional drawings that illustrate a method for reducing the capacitance across the layer of tunnel oxide of an electrically-erasable programmable read-only-memory (EEPROM) cell in accordance with the present invention. As shown in FIG. 3A, the method of the present invention begins with the conventional formation of an EEPROM cell structure 100 that includes buried N+ (BN+) source and drain regions 114 and 116, respectively, which are formed in a lightly-doped p-type substrate 112, BN+ oxide regions 118 and 120 which are grown over BN+ source and drain regions 114 and 116, respectively, and a layer of cell gate oxide 122.

Figure 3B:
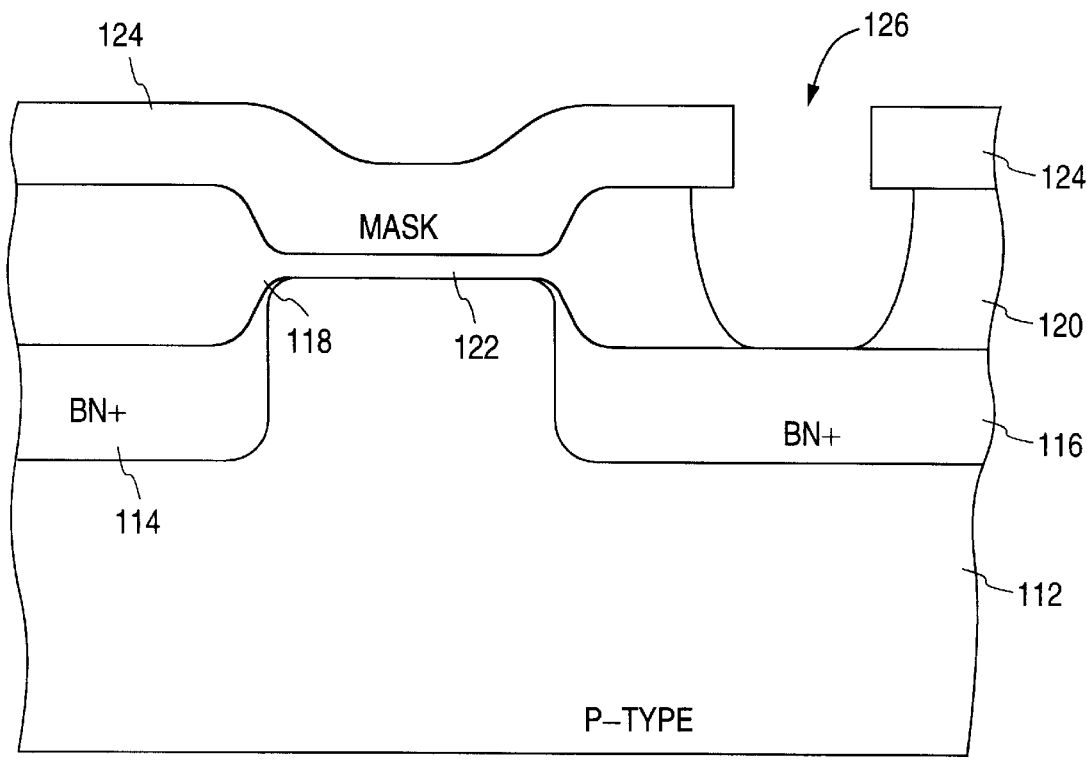

Once cell structure 100 has been formed, the method of the present invention begins with the formation and patterning of a tunnel window mask 124 that exposes a portion of BN+ oxide region 120. After mask 124 has been formed, as shown in FIG. 3B, the unmasked regions of BN+ oxide 120 are then etched with a buffered oxide etch (BOE) or a similar etching chemistry to form a tunnel window 126 that exposes a portion of BN+ drain region 116. Following this, mask 124 (the patterned resist) is baked to remove solvents and to harden the mask.

Figure 3C:
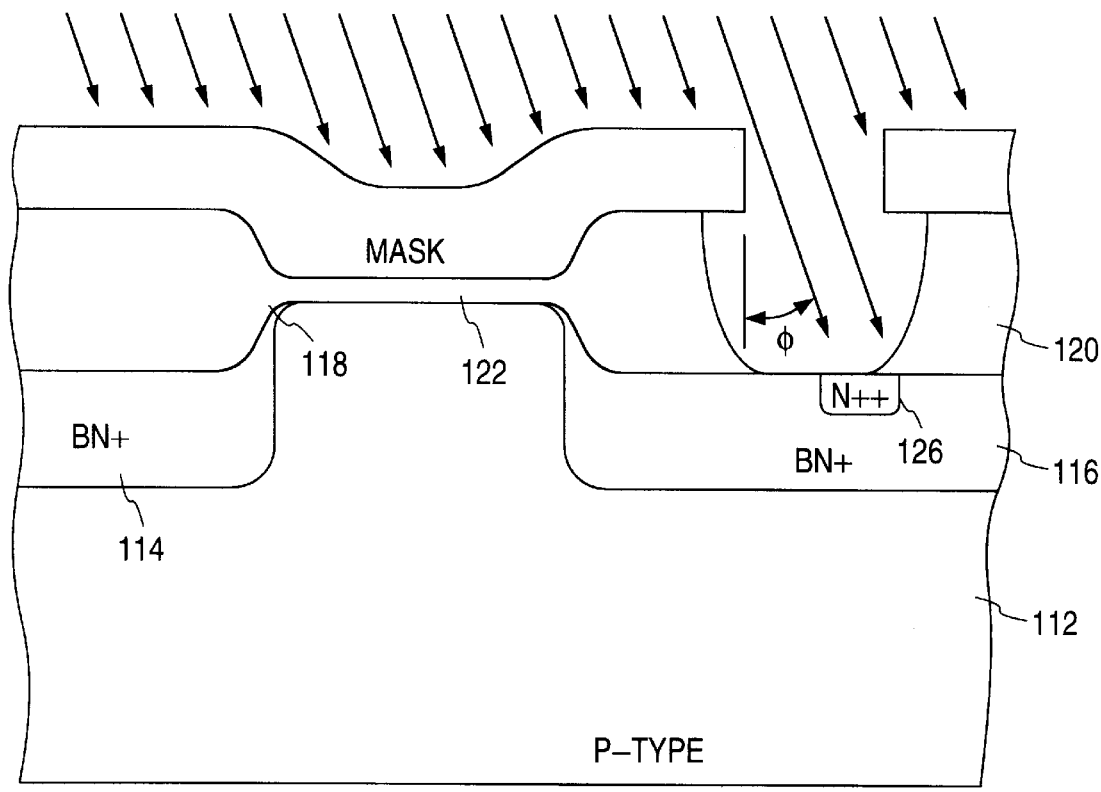

Next, in accordance with the present invention, as shown in FIG. 3C, a region of the exposed portion of BN+ drain region 116 is implanted with an n-type material, such as arsenic, at an implant angle φ, a dose of approximately $5 \times 10^{15} – 5 \times 10^{16}$ ions/cm$^2$ (high dose), and an implant energy of approximately 25–40 KeV (low energy) to form a region of N++ material 126 within the BN+ drain region 116.

In the present invention, the implant angle φ ranges from greater than 0° to less than 90° so that less than the entire surface of drain region 116 is implanted. In addition to varying the angle of the implant, further control of the angle φ can be obtained by varying the thickness of mask 124.

Figure 3D:
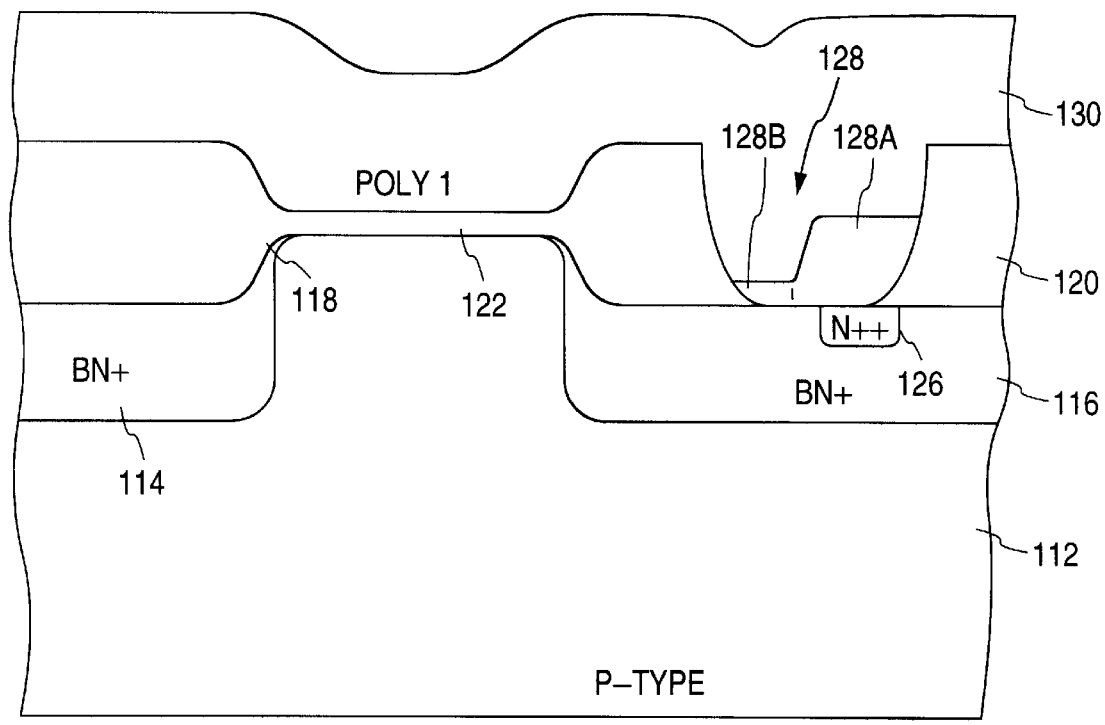

Following the angled implant of drain region 116, as shown in FIG. 3D, a layer of tunnel oxide 128 is grown over drain region 116. As a result of the angled implant, however, a thick layer of tunnel oxide 128A is formed over the N++ implanted region 126 while a thin layer of tunnel oxide 128B approximately 80 Å thick is formed over the N+ region of drain 116. The thickness of the thick layer of tunnel oxide 128A will typically be 4–7× greater than the thickness of the thin layer of tunnel oxide 128B, but may be as much as 10× the growth rate of the thin layer of tunnel oxide 128B in an 850° C. dry ambient.

With conventional tunnel windows, the layer of tunnel oxide has a uniform thickness. As a result, the capacitance across the layer of tunnel oxide $C_{TUN}$ is determined by the equation $C_{TUN}=(\epsilon_0\epsilon/T_{TUN})A$ where $T_{TUN}$ represents the thickness of the tunnel oxide and A represents the tunnel window area in microns squared.

However, by forming a layer of tunnel oxide with two different thicknesses, the capacitance across the layer of tunnel oxide $C_{TUN}$ is determined by the equation $C_{TUN}=(\epsilon_0\epsilon/T_{TUN})A[\gamma+(1/n)(1-\gamma)]$ where γ represents the area ratio between the thin and thick layers of tunnel oxide, and n represents the thickness ratio between the thick and thin layers of oxide.

For example, if the width of the thick layer of tunnel oxide 128A is 1 micron, and the width of the thin layer of tunnel oxide 128B is 0.5 microns, then γ equals 0.5 (0.5/1.0, assuming the lengths to be equal). Further, if the thickness of the thick layer of tunnel oxide 128A is 400 Å and the thickness of the thin layer of tunnel oxide 128B is 80 Å, then n equals 5 (400/80).

Filling in the equation results in $C_{TUN}=(\epsilon_0\epsilon/T_{TUN})A[0.5+(1/5)(1-0.5)]=C_{TUN}=(\epsilon_0\epsilon/T_{TUN})A(0.6)$ Thus, by forming the thick layer of tunnel oxide 128A to have twice the area and five times the thickness of the thin layer of tunnel oxide 128B, the capacitance across the layer of tunnel oxide 128 is reduced to approximately 60% of the capacitance that would be present with a conventionally formed layer of tunnel oxide.

In addition, further reductions in the area of the thin layer of tunnel oxide 128B can lead to even more substantial results. For example, if the width of the thin layer of tunnel oxide 128B is reduced to approximately 0.14 microns while the width of the thick layer of tunnel oxide 128A is increased to approximately 1.36 microns, then the capacitance across the layer of tunnel oxide 128 is reduced to approximately 28% of the capacitance that would be present with a conventionally formed layer of tunnel oxide.

Returning to FIG. 3D, after the layer of thick and thin tunnel oxide 128A/128B has been grown, a first layer of polysilicon (poly1) 130 is deposited over the structure. Following this, the method continues with conventional EEPROM processing steps.

Figure 4:
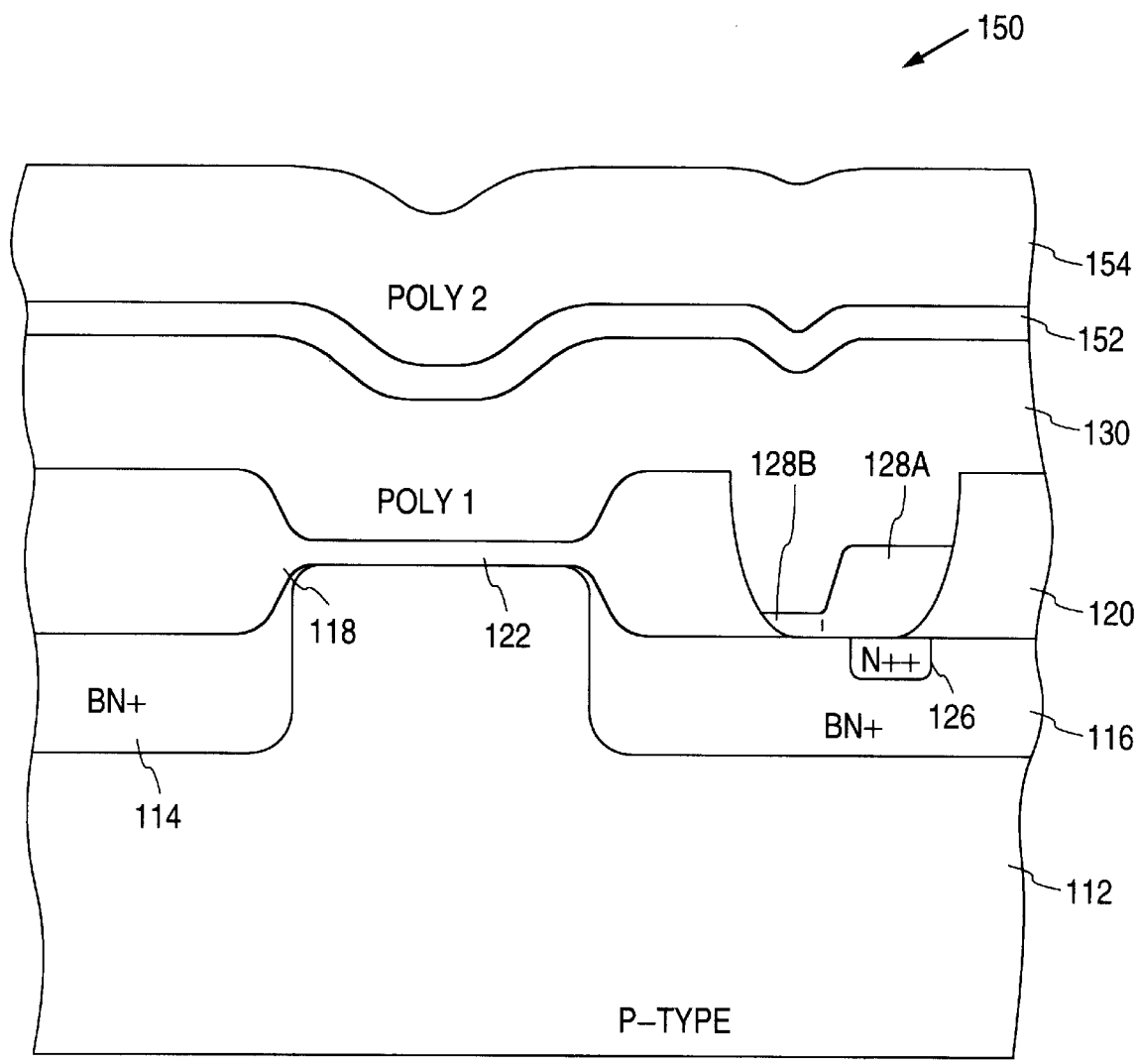
FIG. 4 is a cross-sectional diagram illustrating an EEPROM cell 150 formed in accordance with the method of the present invention.

FIG. 4 shows a cross-sectional diagram that illustrates an EEPROM cell 150 formed in accordance with the method of the present invention. As shown in FIG. 4, in addition to including BN+ source and drain regions 114 and 116, BN+ oxide regions 118 and 120, cell gate oxide layer 122, tunnel oxide layers 128A and 128B, and poly1 layer 130, cell 150 further includes a layer of interpoly dielectric 152 formed over poly1 layer 130, and a second layer of polysilicon (poly2) 154 formed over the layer of interpoly dielectric 152.

Thus, a method for reducing the capacitance across the layer of tunnel oxide has been described. By reducing the capacitance across the layer of tunnel oxide, the programming window can be substantially increased which, in turn, increases the manufacturing yield, reduces the time required to read the cells, and lengthens the life cycle of the cells.

It should be understood that various alternatives to the embodiment of the invention described herein may be employed in practicing the invention. Thus, it is intended that the following claims define the scope of the invention and that methods and structures within the scope of these claims and their equivalents be covered thereby.

What is claimed is:

1. An electrically-erasable programmable read-only-memory (EEPROM) cell formed in a substrate of a first conductivity type, the EEPROM cell comprising:

spaced-apart buried regions formed in the substrate, the buried regions having a first concentration of a second conductivity type;

spaced-apart oxide regions formed over the buried regions so that an oxide region is formed over each buried region, one of the oxide regions having a tunnel window that exposes a portion of the buried region underlying said one of the oxide regions, said portion of the buried region having a first area and a second area, the first area of said portion of the buried region having a dopant concentration higher than the second area of said portion of the buried region;

a layer of cell rate oxide formed over the substrate between the oxide regions; and a layer of tunnel oxide formed over said portion of the buried region so that the layer of tunnel oxide formed over the first area is thicker than the layer of tunnel oxide formed over the second area.

2. The EEPROM cell of claim 1 and further comprising a layer of polysilicon formed over the spaced apart oxide regions, the layer of cell gate oxide, and the layer of tunnel oxide.

3. A memory cell formed in a substrate of a first conductivity type, the cell comprising:

a first region of a second conductivity type formed in the substrate;

a second region of the second conductivity type formed in the substrate, the second region being spaced-apart from the first region and having a first surface region, a second surface region, and a third surface region;

a first dielectric having a first thickness and contacting the first surface region;

a second dielectric having a second thickness and contacting the second surface region, the second thickness being greater than the first thickness, the second dielectric contacting the first dielectric; and a third dielectric having a third thickness and contacting the third surface region, the third thickness being greater than the second thickness, the third dielectric contacting the first and second dielectrics.

4. The cell of claim 3 wherein the first, second and third dielectrics are an oxide.

5. The cell of claim 3 wherein the first dielectric is tunnel oxide.

6. The cell of claim 3 wherein the second surface region has a dopant concentration higher than the first surface region.

7. The cell of claim 3 wherein the second surface region has a dopant concentration higher than the third surface region.

8. The cell of claim 3 and further comprising a conductive layer contacting the first, second, and third dielectrics.

9. The cell of claim 8 wherein the conductive layer includes a layer of doped polysilicon.

10. The cell of claim 3 and further comprising:

a channel region defined in the substrate between the first and second regions;

a fourth dielectric formed over the channel region;

a first conductive layer contacting the first, second, third, and fourth dielectrics;

a fifth dielectric formed over the first conductive layer; and a second conductive layer formed over the fifth dielectric layer.

11. A memory cell formed in a substrate of a first conductivity type, the cell comprising:

a first region of a second conductivity type formed in the substrate;

a second region of the second conductivity type formed in the substrate, the second region being spaced-apart from the first region and having a first surface region, a second surface region contacting the first surface region, and a third surface region contacting the first and second surface regions;

a dielectric layer contacting the second region and having a plurality of thicknesses such that the dielectric layer formed over the first surface region has a first thickness, the dielectric layer formed over the second surface region has a second thickness, and the dielectric layer formed over the third surface region has a third thickness, the second thickness being greater than the first thickness, the third thickness being greater than the second thickness.

12. The cell of claim 11 wherein the dielectric layer is an oxide.

13. The cell of claim 11 wherein the second surface region has a dopant concentration higher than the first surface region.

14. The cell of claim 11 wherein the second surface region has a dopant concentration higher than the third surface region.

15. The cell of claim 11 and further comprising:

a channel region defined in the substrate between the first and second regions;

a layer of gate oxide formed over the channel region;

a first conductive layer contacting the dielectric layer and the layer of gate oxide;

an interconductive dielectric formed over the first conductive layer; and a second conductive layer formed over the interconductive dielectric layer.

16. A memory cell formed in a substrate of a first conductivity type, the cell comprising:

spaced-apart conductive regions formed in the substrate, the conductive regions having a first concentration of a second conductivity type;

spaced-apart first insulation regions formed over the conductive regions so that a first insulation region is formed over each conductive region, one of the first insulation regions having a tunnel window that exposes a portion of a conductive region underlying said one of the first insulation regions, said portion of the conductive region having a first area and a second area, the first area of said portion of the conductive region having a dopant concentration higher than the second area of said portion of the conductive region;

a first layer of insulation formed over the substrate between the conductive regions; and a second layer of insulation formed over said portion of the conductive region so that the second layer of insulation formed over the first area is thicker than the second layer of insulation formed over the second area.

17. The cell of claim 16 wherein the first insulation regions are formed from an oxide.

18. The cell of claim 16 wherein the first and second layers of insulation are formed from an oxide.

19. The cell of claim 16 and further comprising:

a channel region defined in the substrate between the conductive regions;

a first conductive layer contacting the first, and second layers of insulation;

a third layer of insulation formed over the first conductive layer; and a second conductive layer formed over the third layer of insulation.

* * * * *

UNITED STATES PATENT AND TRADEMARK OFFICE
CERTIFICATE OF CORRECTION

PATENT NO.: 5,844,269
DATED: December 1, 1998
INVENTOR(S): Max C. Kuo

It is certified that an error appears in the above-identified patent and that said Letters Patent is hereby corrected as shown below:

In Col. 6, line 13, delete "rate" and replace with --gate--.

Signed and Sealed this

Thirtieth Day of March, 1999

Q. TODD DICKINSON

Attest:

Attesting Officer

Acting Commissioner of Patents and Trademarks